United States Patent
Katz et al.

(10) Patent No.: US 7,825,693 B1
(45) Date of Patent: Nov. 2, 2010

(54) REDUCED DUTY CYCLE DISTORTION USING CONTROLLED BODY DEVICE

(75) Inventors: Oded Katz, Haifa (IL); Israel A. Wagner, Zichron-Yaakov (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/550,877

(22) Filed: Aug. 31, 2009

(51) Int. Cl.
    *H03K 19/094* (2006.01)
(52) U.S. Cl. .............................. 326/83; 326/27; 326/81
(58) Field of Classification Search .................. 326/26, 326/27, 80–87
    See application file for complete search history.

(56) References Cited

U.S. PATENT DOCUMENTS

| | | | |
|---|---|---|---|
| 5,264,745 A | 11/1993 | Woo | |
| 5,591,650 A | 1/1997 | Hsu et al. | |
| 5,646,900 A | 7/1997 | Tsukude et al. | |
| 5,828,095 A | 10/1998 | Merritt | |
| 6,118,318 A * | 9/2000 | Fifield et al. | 327/206 |
| 6,133,799 A * | 10/2000 | Favors et al. | 331/57 |
| 6,157,216 A | 12/2000 | Lattimore et al. | |
| 6,211,699 B1 | 4/2001 | Sudjian | |
| 6,452,448 B1 | 9/2002 | Bonaccio et al. | |
| 6,731,157 B2 | 5/2004 | Fulkerson | |
| 7,109,532 B1 | 9/2006 | Lee et al. | |
| 7,176,720 B1 | 2/2007 | Prather et al. | |

OTHER PUBLICATIONS

S. C. Terry et. al. : "Adaptive Gate Biasing—A New Solution for Body-Driven Current Mirrors", GLSVLSI'05, Apr. 17-19, 2005, Chicago, Illinois, USA, pp. 472-477.

* cited by examiner

*Primary Examiner*—Don P Le

(57) ABSTRACT

A semiconductor chip comprising a reference circuit and a target circuit. The reference circuit comprises a first P-channel field effect transistor (PFET) and a first N-channel field effect transistor (NFET). A reference voltage is connected to gates of the first PFET and first NFET. A body control voltage node is formed by connecting a drain of the first PFET, a body of the first PFET, a drain of the first NFET and a body of the first NFET. A target circuit comprises a second PFET and a second NFET. The body control voltage node is connected to a body of the second PFET and the second NFET. The body control voltage improves duty cycle in the target circuit compared to a similarly designed circuit having PFET bodies connected to Vdd and NFET bodies connected to Ground.

10 Claims, 7 Drawing Sheets

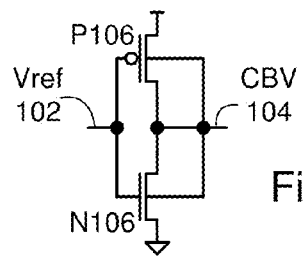
Inverter Reference Circuit
100
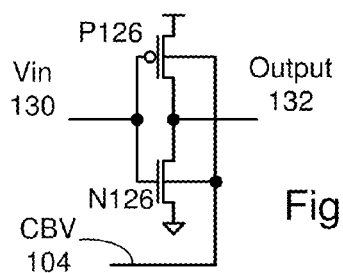
Inverter Target Circuit
120
Fig. 1A
Fig. 1B
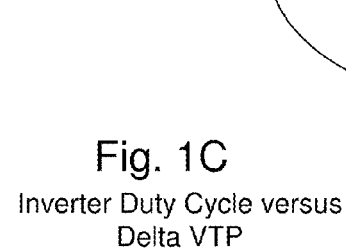
Fig. 1C
Inverter Duty Cycle versus Delta VTP
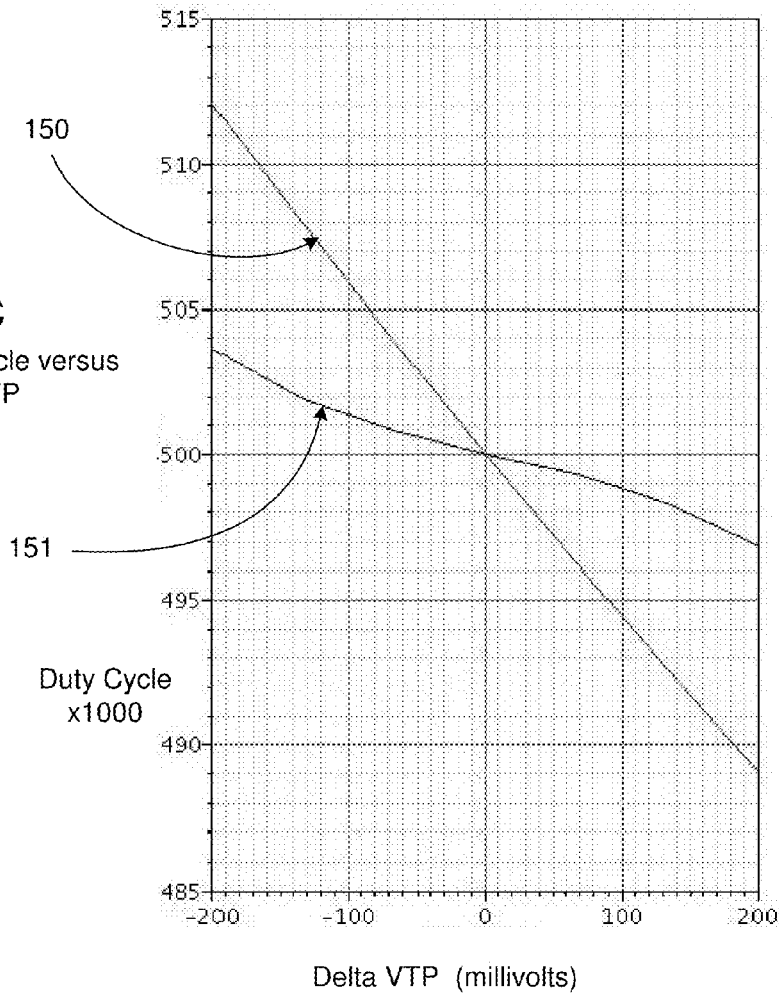
Delta VTP (millivolts)

NAND Reference Circuit
200

NAND Target Circuit
220

NAND Duty Cycle versus Delta VTP

NOR Reference Circuit 300

NOR Target Circuit 320

NOR Duty Cycle versus Delta VTP

Duty Cycle x1000

Delta VTP (millivolts)

Ring Oscillator Duty Cycle
versus Delta VTP

CBV voltages versus Delta VTP (millivolts)

Inverter Reference Circuit
Currents versus
Temperature
Vdd=1.0
Delta Pvt=-200mv

REDUCED DUTY CYCLE DISTORTION USING CONTROLLED BODY DEVICE

FIELD OF THE INVENTION

This invention relates generally to semiconductor chips, and more specifically to reducing duty cycle distortion using controlled body devices (CBD) to equalize N-channel FET (NFET) and P-channel FET (PFET) strengths.

SUMMARY OF EMBODIMENTS OF THE INVENTION

Embodiments of the invention include a semiconductor chip comprising a reference circuit that generates a body voltage, the semiconductor chip further comprising a target circuit that uses the body voltage.

The reference circuit comprises a first P-channel field effect transistor (PFET) and a first N-channel field effect transistor (NFET). A body control node is connected to a drain of the first PFET, to a drain of the first NFET, to a body of the first PFET, and to a body of the first NFET. A reference voltage is connected to a gate of the first PFET and to a gate of the first NFET.

The target circuit comprises a second PFET comprising a body connected to the body control node, a second NFET comprising a body connected to the body control node. An input is connected to a gate of the second PFET and to a gate of the second NFET. The target circuit comprises an output connected to a drain of the second PFET and to a drain of the second NFET.

BRIEF DESCRIPTION OF THE DRAWINGS

FIG. 1A is a circuit schematic of an inverter reference circuit that provides a body bias voltage usable in an inverter target circuit.

FIG. 1B is a circuit schematic of an inverter target circuit that uses the body bias voltage generated by the inverter reference circuit of FIG. 1A.

FIG. 1C is a graph of duty cycle versus PFET threshold voltage variation for a conventional inverter circuit and for the inverter target circuit.

DETAILED DESCRIPTION OF THE EMBODIMENTS

Figure 2A:
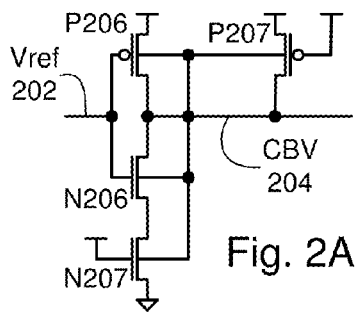
FIG. 2A is a circuit schematic of a NAND reference circuit that provides a body bias voltage usable in a NAND target circuit.

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for using body bias control to force P-channel Field Effect Transistor (PFET) strength to be substantially equal to N-channel Field Effect transistor (NFET) strength, for a first given width/length ratio of the PFET and a second given width length ratio of the NFET. Maintenance of substantially equal NFET and PFET strength provides for a reduction in duty cycle distortion. A reference circuit is provided that receives a reference voltage, typically Vdd/2, and has a body control node formed by an electrical connection of a drain of the PFET, a drain of the NFET, a body of the PFET, and a body of the NFET. Body control nodes herein will be designated as "CBV" with various reference numbers depending on particular embodiments. The body control node is then connected to bodies of other PFETs and other NFETs to control PFET and NFET strength. Such controlled circuitry provides improved duty cycle fidelity compared to conventional uncontrolled circuitry. Duty cycle fidelity herein refers to a duty cycle of an output of a circuit versus a duty cycle of an input of the circuit. For example, if an input to a circuit has a 0.5 duty cycle (50% of the time "up"; 50% of the time "down"), a circuit that receives the input and has an output with a duty cycle of 0.510 would have an improved duty cycle fidelity versus another circuit receiving the input and has an output with a duty cycle of 0.520.

It will be recalled that drain to source current in an FET is a function of a threshold voltage of the FET, and that the threshold voltage of the FET is a further function of source to body voltage. Basic FET equations for current and threshold are given below. It is understood that these equations are "basic" and that many additional terms are necessary to very accurately calculate current and threshold of modern very short channel FETs.

$$JDS = 0.5*GM*WL*(VGS-VT)**2 \text{ above pinchoff} \quad (1)$$

$$JDS = GM*WL*VDS*(VGS-VT-VDS/2) \text{ below pinchoff} \quad (2)$$

$$VT = VFB + K*(VSSUB+PSI)**0.5 \quad (3)$$

Where:

GM=Normalized transconductance

WL=Width to Length ratio of the FET device

VT=Threshold Voltage

VGS=Gate to source voltage

VDS=Drain to source voltage

VFB=Flat band voltage

K=Constant

PSI=The electrostatic potential on the silicon surface at the onset of channel conduction.

VSSUB=Source to body voltage.

Referring now to FIGS. 1A, 1B, and 1C, an embodiment of the invention is shown, using an inverter circuit configuration. Inverter reference circuit 100 comprises PFET P106 and NFET N106. A gate of PFET P106 and a gate of NFET N106 are coupled to a reference voltage, Vref 102. Inverter reference circuit 100 has a body control node, CBV 104, as an output. CBV 104 is coupled to a body of PFET P106, a body of NFET N106, a drain of PFET P106, and a drain of NFET N106. Typically Vref 102 has a voltage value of Vdd/2. However, Vref 102 can have a different voltage. For example, if CBV 104 is intended to be used in a differential receiver (not shown) which is used with an intended common mode input above Vdd/2, Vref 102 can be set at the intended common mode voltage.

CBV 104 provides a voltage at which P106 and N106 are controlled to have the same current at the given Vref 102 voltage input. Suppose, on a particular semiconductor chip, NFET threshold values (Vtn) are "high", relative to absolute values of PFET threshold values |Vtp|. NFETs on the semiconductor chip in this scenario are then relatively weak relative to PFETs on the semiconductor chip. Voltage on CBV 104 rises accordingly, increasing the body voltage of N106, thereby reducing Vtn of N106 and strengthening N106, ("strengthening" meaning increasing current flow through the FET, other voltages not changing). Similarly for P106, body-to-source voltage decreases, increasing an absolute value of Vtp, and weakening P106 ("weakening" meaning decreasing current flow through the FET, other voltages not changing). Voltage on CBV 104 rises until drain-source current of P106 equals drain-source current of N106.

Threshold voltages of similar FET devices, such as PFET to PFET or NFET to NFET track across a chip. This means that if one NFET threshold is higher than nominal, a second NFET threshold on the same semiconductor chip will also be higher than nominal. Degree of tracking may vary to some degree in different processes. Degree of tracking is typically closer for devices close together on a chip, versus devices that are far apart on the chip.

FIG. 1B shows an inverter target circuit 120 which uses CBV 104 from inverter reference circuit 100 (FIG. 1A) to improve duty cycle fidelity. Inverter target circuit 120 comprises an inverter further comprising PFET P126 and NFET N126. Inverter target circuit 120 has an input Vin 130 and an output 132. Vin 130 is coupled to a gate of P126 and a gate of N126. A drain of P126 and a drain of N126 are connected to form output 132. Bodies of N126 and P126 are connected to CBV 104, produced by inverter reference circuit 100. Inverter target circuit 120 is designed such that (Wp/Lp)/(Wn/Ln) is the same as (Wp/Lp)/(Wn/Ln) of inverter reference circuit 100. Where Wp is PFET width and Lp is PFET length; Wn is NFET width and Ln is NFET length). CBV 104 provides body bias control to compensate for process variations in thresholds and makes P126 and N126 of equal strength when input 130 is equal to Vref 102.

Connections to FET bodies are well known in the art. U.S. Pat. No. 5,591,650, for example, gives one technique for contacting bodies in a silicon on insulator (SOI) process. In non-SOI semiconductor chips having multiple independent wells, such as in triple well processes, a number of PFETs can be placed in an N-well, the N-well containing reference circuit 100, which biases the N-well to CBV 104, and inverter target circuit 120. A P-well in an N-well in a P-doped substrate may then contain NFETs shown in FIGS. 1A and 1B and be biased at the voltage of CBV 104. Such a "triple well" Complementary Metal Oxide Semiconductor (CMOS) process is well known and is shown in, for example, U.S. Pat. No. 5,828,095.

A simulation was run on inverter target circuit 120 and a conventional inverter (not shown) having identical width and length FET devices as corresponding FET devices in target circuit 120, but the conventional inverter having a body of the PFET connected to VDD and a body of the NFET connected to ground. Vdd for the conventional inverter, inverter reference circuit 100 and inverter target circuit 120 was 1.0 volt. Vref 102 was set at Vdd/2. PFET thresholds in inverter target circuit 120 and in the conventional inverter are varied from −200 mv to +200 mv offset from their nominal value (i.e., "0" on the X-axis of the graph in FIG. 10). NFET thresholds were left at nominal. An input having a 0.500 duty cycle (equal "up" and "down" times) is driven to Vin 130 on inverter target circuit 120 and to an input of the conventional inverter. A duty cycle of the conventional inverter is shown as 150 in FIG. 10 and is seen to vary from 0.512 when Delta Pvt is −200 mv to 0.489 when Delta Pvt is +200 mv; a duty cycle variation of approximately plus or minus 2.4%. In contrast, duty cycle on output 132, shown as 151 in FIG. 10, is seen to vary only from 0.5036 when Delta Pvt is −200 mv to 0.497 when Delta Pvt is +200 mv; a duty cycle variation of approximately plus or minus 0.7%. Such duty cycle improvements are critical in circuits such as clock buffers for example, and may also be valuable in many other circuits.

Figure 2B:
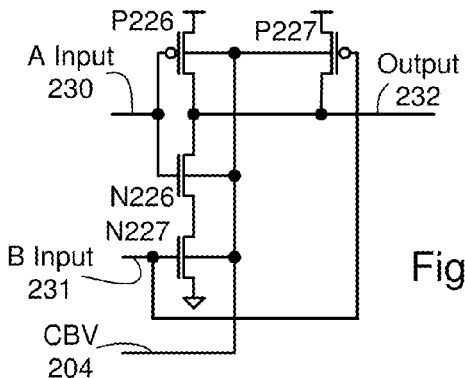
FIG. 2B is a circuit schematic of NAND target circuit that uses the body bias voltage generated by the NAND reference circuit of FIG. 2A.
Figure 2C:
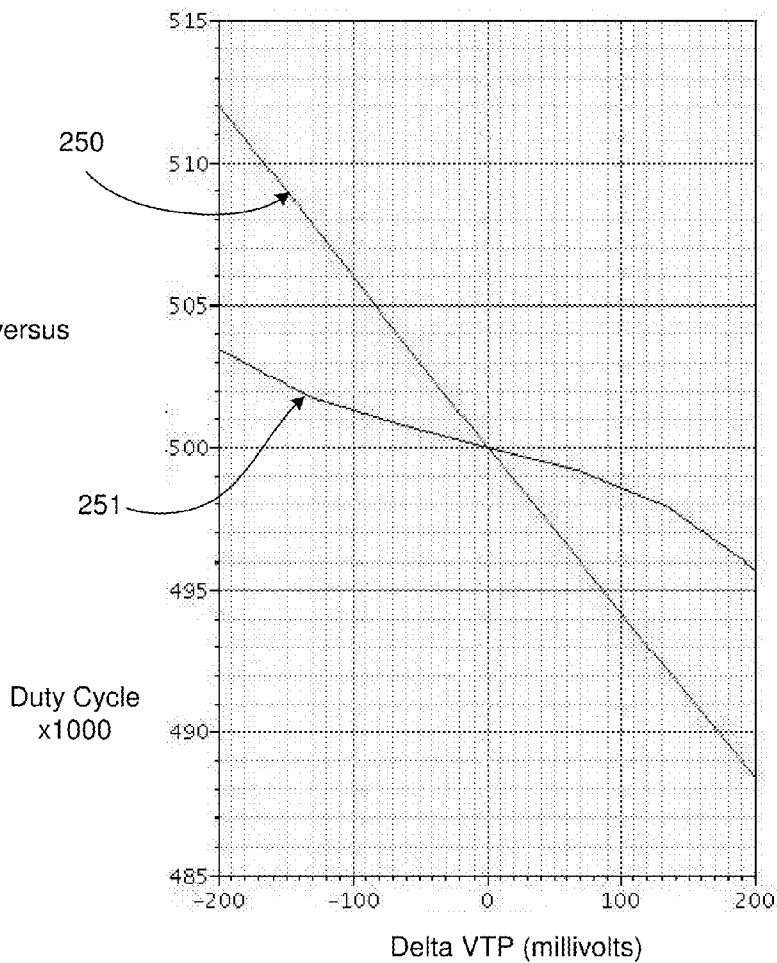
FIG. 2C is a graph of duty cycle versus PFET threshold voltage variation for a conventional NAND circuit and for the NAND target circuit.

FIGS. 2A, 2B, 2C are similar to FIGS. 1A, 1B, 1C but depict an embodiment of the invention in NAND circuitry rather than inverter circuitry.

FIG. 2A shows NAND reference circuit 200, comprising PFETs P206 and P207 and NFETs N206 and N207. Gates of P206 and N206 are connected to Vref 202. Like Vref 102 in FIG. 1, Vref 202 typically is connected to a voltage source of Vdd/2, but may be connected to other voltages in particular applications. A gate of P207 is connected to Vdd; a gate of N207 is connected to Vdd. Drains of P206 and N206 are connected together and to bodies of P206, P207, N206, and N207 to form output CBV 204.

Operation of NAND reference circuit 200 in generation of CBV 204 is similar to operation of inverter reference circuit 100. If a particular chip has a Vtn that is relatively high compared to |Vtp|, NFETs on the particular chip will be weak relative to PFETs on the particular chip. Voltage of CBV 204 will rise, reducing Vtn and increasing |Vtp|, thereby strengthening NFETs and weakening PFETs until current through 206 equals current through N206 and N207.

FIG. 2B shows NAND target circuit 220, which uses CBV 204 to improve duty cycle fidelity. NAND target circuit 220 comprises P226, P227, N226, and N227. A first input to NAND target circuit 220, referenced as 230, is connected to gates of P226 and N226. A second input to NAND target circuit 220, referenced as 231, is connected to gates of P227 and N227. Bodies of P226, P227, N226 and N227 are connected to CBV 204, which is generated by NAND reference circuit 200 as described above. CBV 204 provides body bias control to compensate for process variations in thresholds and makes P226 and the series combination of N226 and N227 of equal strength when input 230 is equal to Vref 202. As described earlier with reference to biasing bodies of PFETs and NFETs with the voltage of CBV 104, providing the voltage of CBV 204 to the NAND FET bodies of FIGS. 2A and 2B can be done by body contacting for SOI processes or well biasing.

FIG. 2C shows simulation results of a duty cycle 250 of a conventional NAND (not shown) and a duty cycle 251 of NAND target circuit 220. Vdd for the conventional NAND circuit, NAND reference circuit 200 and NAND target circuit 220 was 1.0 volt. Vref 202 was set at Vdd/2. The conventional NAND and the NAND target circuit 220 are designed the same except that PFETs in the conventional NAND have bodies connected to VDD and that NFETs in the conventional NAND have bodies connected to Gnd. As "Delta VTP" (a simulated forced variation in Vtp) is varied from −200 mv to +200 mv, duty cycle 250 on the conventional NAND varies from 0.512 to 0.4885 (approximately +2.5% to −2.35%). Duty cycle 251 on the output 232 of NAND target circuit 220 varies from 0.5034 to 0.496 (approximately +0.68% to −0.8%).

Figure 3A:
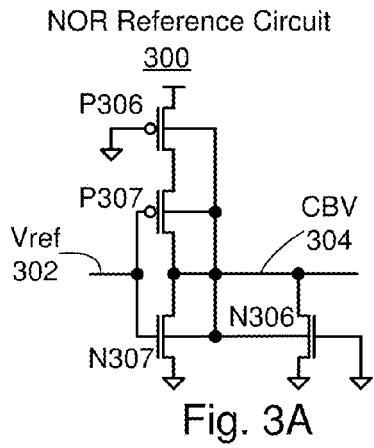
FIG. 3A is a circuit schematic of a NOR reference circuit that provides a body bias voltage usable in a NOR target circuit.
Figure 3B:
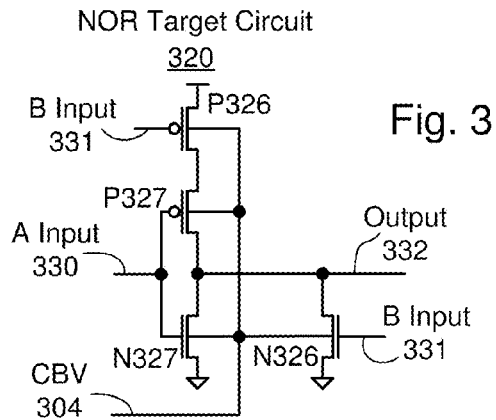
FIG. 3B is a circuit schematic of NOR target circuit that uses the body bias voltage generated by the NOR reference circuit of FIG. 3A.
Figure 3C:
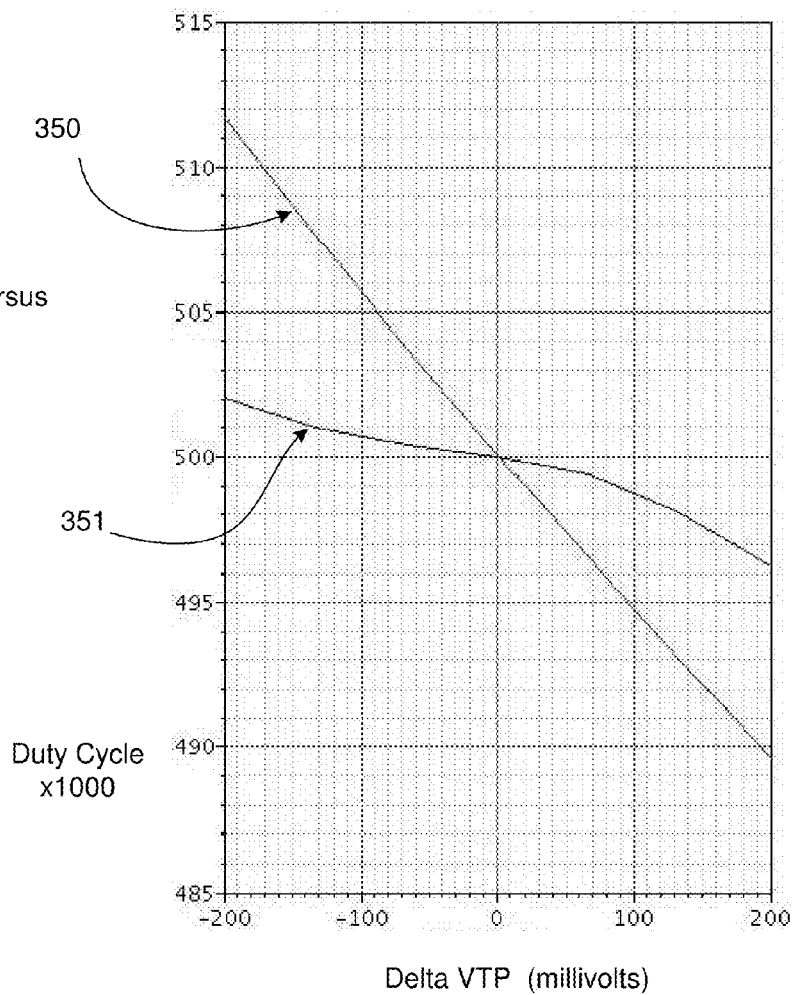
FIG. 3C is a graph of duty cycle versus PFET threshold voltage variation for a conventional NOR circuit and for the NOR target circuit.

FIGS. 3A, 3B, and 3C show an embodiment of the invention for NOR circuitry.

A NOR reference circuit 300 is shown in FIG. 3A. NOR reference circuit 300 comprises PFETs P306 and P307 and NFETs N306 and N307. An input Vref 302 is connected to gates of P307 and N307. Gates of P306 and N306 are connected to Gnd. Input Vref 302 is typically supplied with a voltage of Vdd/2, but, as with Vref 102 (FIG. 1) and Vref 202 (FIG. 2), Vref 302 may be set at a voltage other than Vdd/2. NOR reference circuit 300 outputs CBV 304, which is connected to drains of P307, N307 and bodies of P306, P307, N307 and N306.

Operation of NOR reference circuit 300 in generation of CBV 304 is similar to operation of inverter reference circuit 100. If a particular chip has Vtn that is relatively high compared to |Vtp|, NFETs will be weak relative to PFETs on the chip. Voltage of CBV 304 will rise, reducing Vtn and increasing |Vtp|, thereby strengthening NFETs and weakening PFETs until current through P306 and P307 equals current through N307.

FIG. 3B shows NOR target circuit 320 comprising PFETs P326 and P327 and NFETs N326 and N327 connected as shown. A first input 330 is connected to gates of P327 and N327. A second input 331 is connected to gates of P326 and N326. An output 332 is connected to drains of P327 and N327. CBV 304, which is output by NOR reference circuit 300, is connected to bodies of P326, P327, N326, and N327. Compensation for Vtn versus |Vtp| process variations, using CBV 304 connected to bodies of P326, P327, N326, and N327 is similar to compensation of inverter target circuit 120 and NAND target circuit 220.

FIG. 3C shows simulation results of a duty cycle 350 of a conventional NOR (not shown) and a duty cycle 351 of NOR target circuit 320. Vdd for the conventional NOR circuit, NOR reference circuit 300 and NOR target circuit 320 was 1.0 volt. Vref 302 was set at Vdd/2. The conventional NOR and the NOR target circuit 320 are designed the same except that PFETs in the conventional NOR have bodies connected to VDD and that NFETs in the conventional NOR have bodies connected to Gnd. As "Delta VTP" (a simulated forced variation in Vtp) is varied from −200 mv to +200 mv, duty cycle 350 on the conventional NOR varies from 0.5116 to 0.4896 (approximately +2.3% to −2.1%). Duty cycle 351 on the output 332 of NOR target circuit 320 varies from 0.502 to 0.4962 (approximately +0.40% to −0.8%.

Figure 4A:
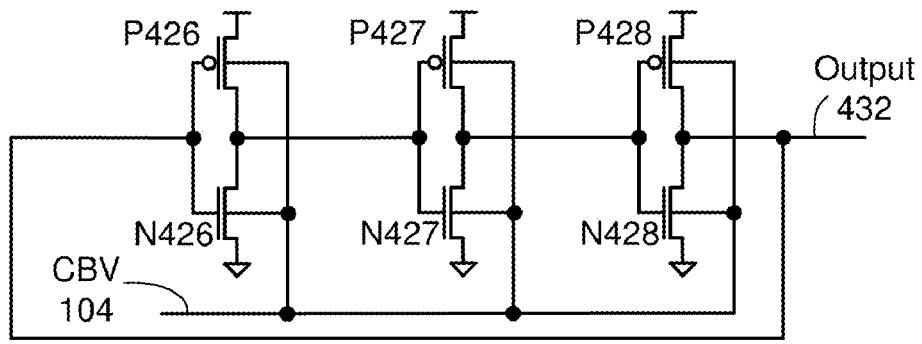
FIG. 4A is a circuit schematic of a ring oscillator target circuit that uses the body bias voltage generated by the inverter reference circuit of FIG. 1A.
Figure 4B:
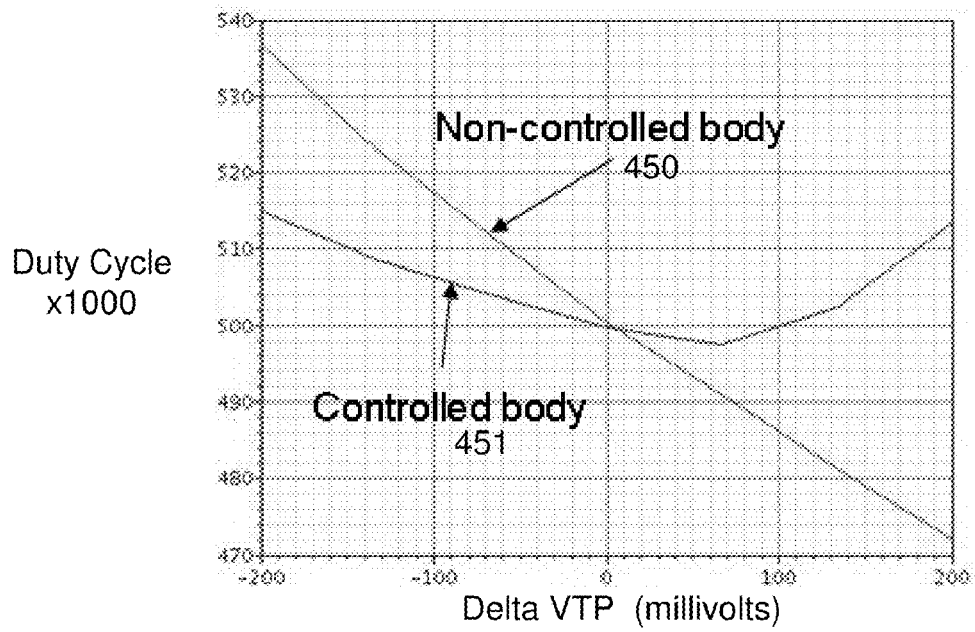
FIG. 4B is a graph of duty cycle versus PFET threshold voltage variation for a conventional ring oscillator circuit and for the ring oscillator target circuit of FIG. 4A.

Yet another embodiment of the invention is shown in FIGS. 4A and 4B. A ring oscillator target circuit 420 is shown in FIG. 4A. Ring oscillator target circuit 420 comprises three instantiations of inverter target circuit 120 (FIG. 1B). A first instantiation of inverter target circuit 120 comprises PFET P426 and NFET N426; a second instantiation of inverter target circuit 120 comprises PFET P427 and NFET N427; and a third instantiation of inverter target circuit 120 comprises PFET P428 and NFET N428. The three instantiations of inverter target circuit 120 are connected as shown in FIG. 4A as a ring oscillator. CBV 104 (FIG. 1A), created in inverter reference circuit 100, is connected to bodies of P426, N426, P427, N427, P428, and N428. An output 432 of ring oscillator target circuit 420 is connected to gates of the first instantiation of inverter target circuit 120.

FIG. 4B shows simulation results of a duty cycle 450 of a conventional ring oscillator (not shown) and a duty cycle 451 of ring oscillator target circuit 420. Vdd for all circuits was set at 1.0 volt. Vref 102 of inverter reference circuit 100 (FIG. 1) was set at Vdd/2. The conventional ring oscillator and the ring oscillator target circuit 420 are designed the same except that PFETs in the conventional ring oscillator have bodies connected to VDD and that NFETs in the conventional ring oscillator have bodies connected to Gnd. As "Delta VTP" (a simulated forced variation in Vtp) is varied from −200 mv to +200 mv, duty cycle 450 on the conventional ring varies from 0.537 to 0.472 (approximately +7.4% to −5.9%). Duty cycle 451 on the output 432 of ring oscillator target circuit 420 varies from 0.515 to 0.498 (approximately +3.0%% to −0.4%).

Figure 5:
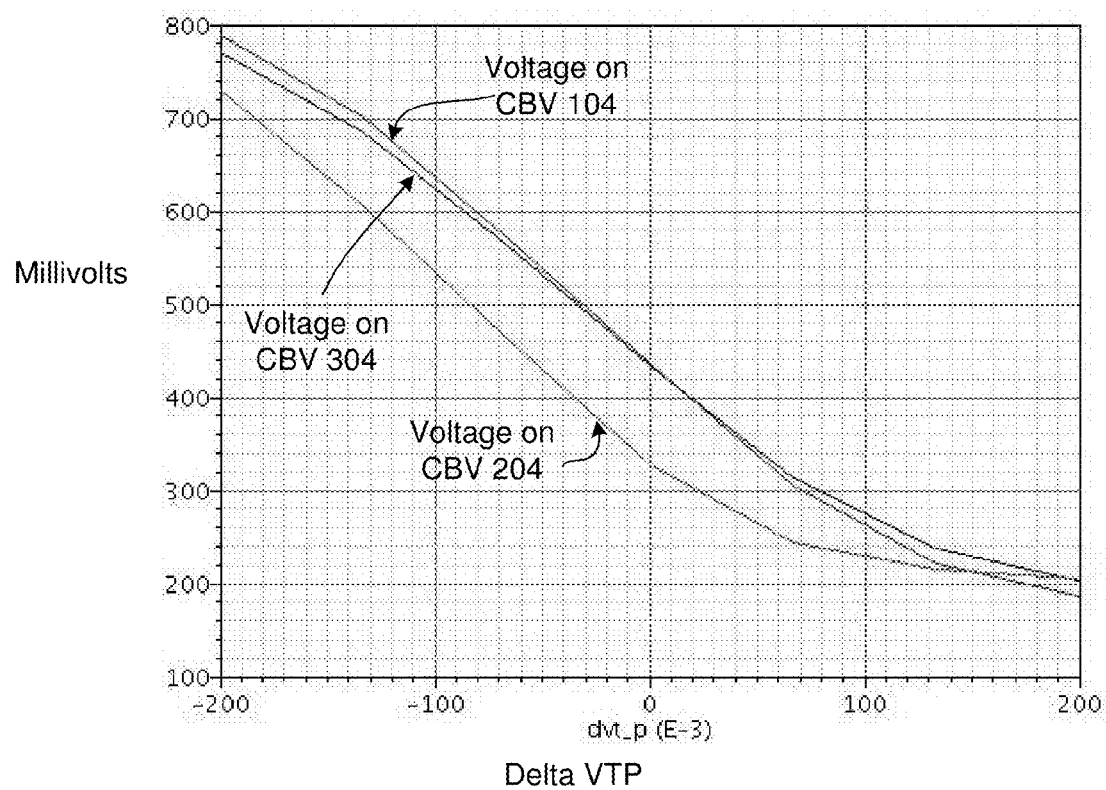
FIG. 5 is a graph of the body bias voltage output by the inverter reference circuit of FIG. 1A, the NAND reference circuit of FIG. 2A, and the NOR reference circuit of FIG. 3A, versus PFET threshold variation.

FIG. 5 shows voltages of CBV 104 (FIG. 1A), CBV 204 (FIG. 2A) and CBV 304 (FIG. 3A) versus Delta VTP, where Delta VTP is the forced variation of PFET threshold Vtp from a nominal Vtp, NFET thresholds Vtn being held constant. It will be noted that, at extreme variations of PFET thresholds, and with Vdd=1.0 volt, body-source junctions begin to forward bias significantly causing significant body-source currents to flow and somewhat reducing effectiveness of body control at such extreme threshold variations. Nonetheless, as shown in simulations graphed in FIGS. 1C, 2C, 3C, and 4B, significant improvements over conventional duty cycles is still achieved.

Figure 6:
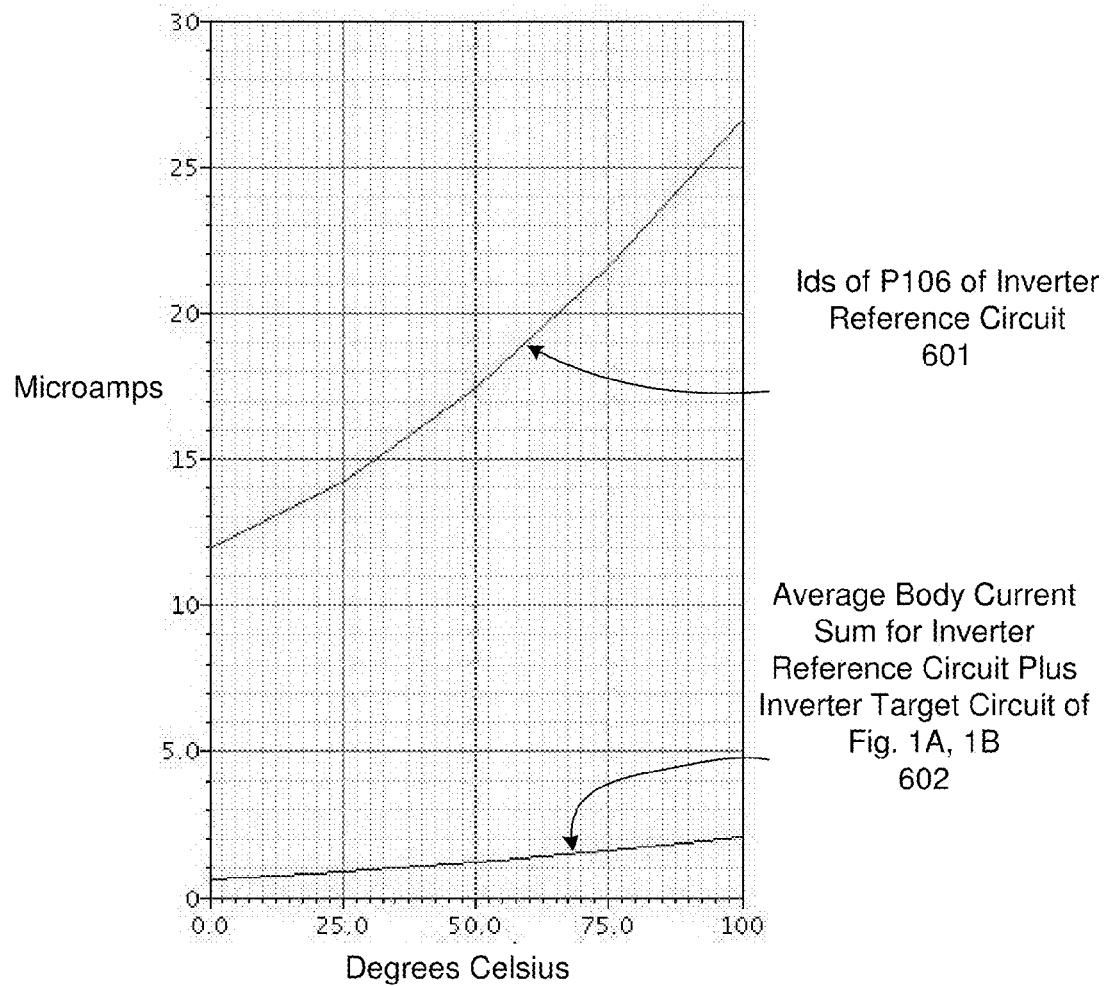
FIG. 6 shows drain to source current of the PFET of inverter reference circuit and body current sum of the inverter reference circuit and the inverter target circuit of FIG. 1A and FIG. 1B versus temperature in degrees Celsius. PFET threshold variation is held at −200 mv.

FIG. 6 shows a graph of drain to source current 601 of P106 and body current 602, which is the total body current sum of N106 of inverter reference circuit 100 and N126 of inverter target circuit 120 (FIG. 1) versus temperature, with a −200 mV Delta Pvt (PFET threshold variation forced in the simulation) and a Vdd of 1.0 volt. Body currents in inverter target circuit 120 vary depending on whether Vin 130 is at a logical "1" or a logical "0", so several cycles of simulation were performed, with the currents 601 and 602 averaged over the several cycles. The simulation demonstrates that, even with the large PFET threshold variation and at 100 degrees Celsius, that body current is still relatively small. In future technologies having Vdd significantly less than 1.0 volt, body-source junctions will forward bias even less, with attendant reduction in body current.

Figure 7:
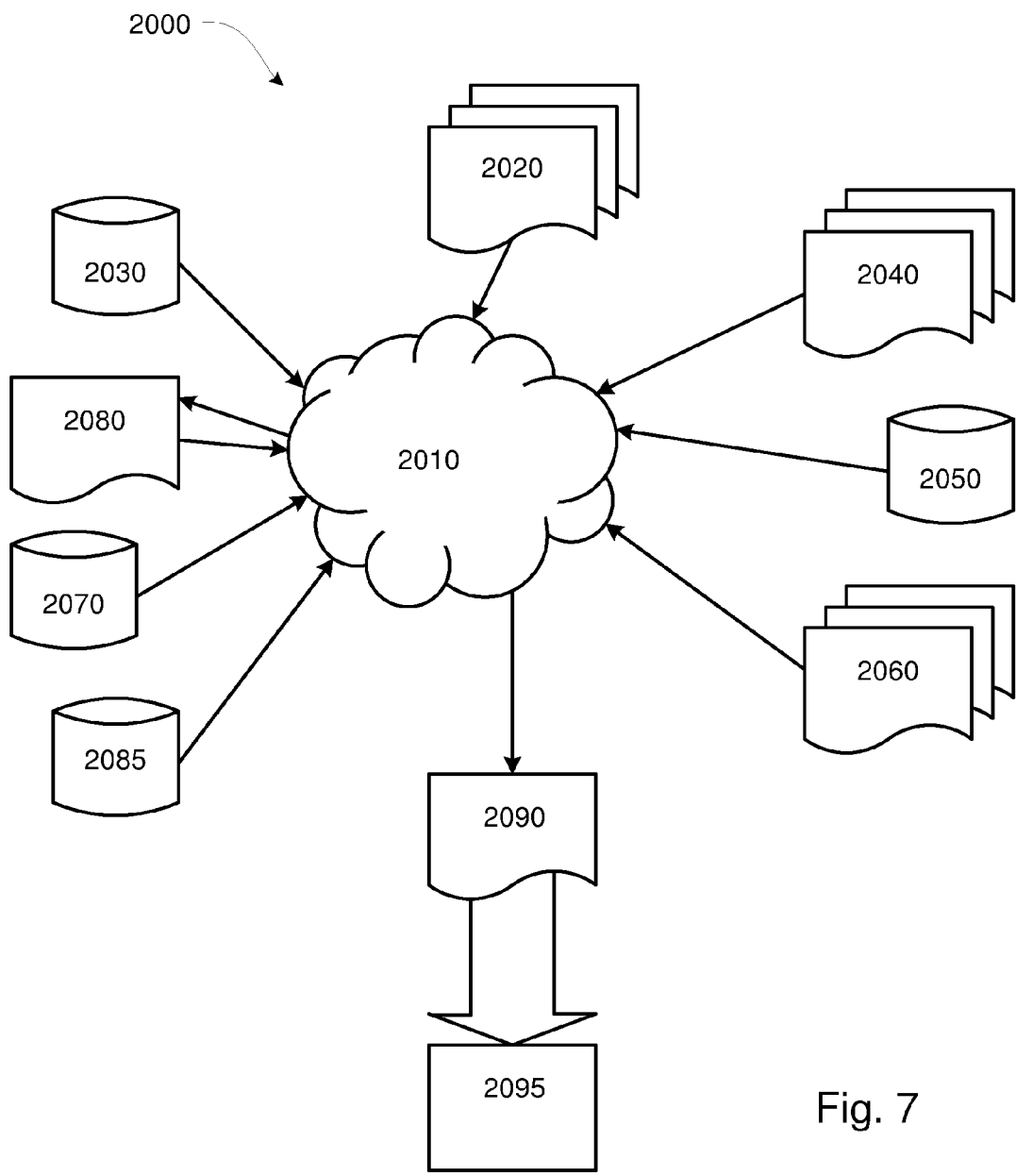
FIG. 7 shows a design process and a design structure used to produce, characterize, and test the circuits of embodiments of the invention.

FIG. 7 shows a block diagram of an example design flow 2000 that may be used for the semiconductor chip having a reference circuit and a target described herein. Design flow 2000 may vary depending on the type of integrated circuit being designed. For example, a design flow 2000 for a static random access memory may differ from a design flow 2000 for a dynamic random access memory. In addition, design flow 2000 may differ for different semiconductor processes. Design structure 2020 is preferably an input to a design process 2010 and may come from an IP provider, a core developer, or other design company or may be generated by the operator of the design flow, or from other sources. Design structure 2020 comprises circuits described above, for examples in FIGS. 1A, 1B, 2A, 2B, 3A, 3B, and 4A in the form of schematics or HDL, a hardware-description language (e.g., Verilog, VHDL, C, etc.). Design structure 2020 may be contained on one or more tangible computer readable medium. For example, design structure 2020 may be a text file or a graphical representation of circuits described above. Examples of tangible computer readable medium include hard disks, floppy disks, magnetic tapes, CD ROMs, DVD, flash memory devices, and the like. Design process 2010 preferably synthesizes (or translates) the circuits described above into a netlist 2080, where netlist 2080 is, for example, a list of wires, transistors, logic gates, control circuits, I/O, models, etc. that describes the connections to other elements and circuits in an integrated circuit design and recorded on the at least one computer readable medium. This may be an iterative process in which netlist 2080 is resynthesized one or more times depending on design specifications and parameters for the circuit.

Design process 2010 may include using a variety of inputs; for example, inputs from library elements 2030 which may house a set of commonly used elements, circuits, and devices, including models, layouts, and symbolic representations, for a given manufacturing technology (e.g., different technology nodes, 32 nm, 45 nm, 90 nm, etc.), design specifications 2040, characterization data 2050, verification data 2060, design rules 2070, and test data files 2085 (which may include test patterns and other testing information). Design process 2010 may further include, for example, standard circuit design processes such as timing analysis, verification, design rule checking, place and route operations, etc. One of ordinary skill in the art of integrated circuit design can appreciate the extent of possible electronic design automation tools and applications used in design process 2010 without deviating from the scope and spirit of the invention. The design structure of the invention is not limited to any specific design flow.

Design process 2010 preferably translates an embodiment of the invention as shown in the various logic diagrams and the underlying circuitry along with any additional integrated circuit design or data (if applicable), into a second design structure 2090. Design structure 2090 resides on a tangible computer readable storage medium in a data format used for the exchange of layout data of integrated circuits (e.g. information stored in a GDSII (GDS2), GL1, OASIS, or any other suitable format for storing such design structures). Design structure 2090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the logic diagrams in the figures. Design structure 2090 may then proceed to a stage 2095 where, for example, design structure 2090 proceeds to tape-out, is released to manufacturing, is released to a mask house, is sent to another design house, is sent back to the customer, etc.

What is claimed is:

1. A semiconductor chip comprising:
   a reference circuit comprising:
      a first p-channel field effect transistor (PFET);
      a first n-channel field effect transistor (NFET);
      a body control node connected to a drain of the first PFET, a drain of the first NFET, a body of the first PFET and a body of the first NFET; and
      a reference voltage connected to a gate of the first PFET and to a gate of the first NFET; and
   a target circuit comprising:
      a second PFET comprising a body connected to the body control node;
      a second NFET comprising a body connected to the body control node;
      an input connected to a gate of the second PFET and to a gate of the second NFET; and
      an output connected to a drain of the second PFET and to a drain of the second NFET.

2. The semiconductor chip of claim 1, the reference voltage set at Vdd/2.

3. The semiconductor chip of claim 1, the target circuit comprising an inverter.

4. The semiconductor chip of claim 1, the target circuit comprising a NAND.

5. The semiconductor chip of claim 1, the target circuit comprising a NOR.

6. The semiconductor chip of claim 1, the target circuit comprising a ring oscillator.

7. A design structure, embodied in a machine readable medium used in a design process for a semiconductor chip, the design structure comprising:
   a reference circuit comprising:
      a first p-channel field effect transistor (PFET);
      a first n-channel field effect transistor (NFET);
      a body control node connected to a drain of the first PFET, a drain of the first NFET, a body of the first PFET and a body of the first NFET; and
      a reference voltage connected to a gate of the first PFET and to a gate of the first NFET; and
   a target circuit comprising:
      a second PFET comprising a body connected to the body control node;
      a second NFET comprising a body connected to the body control node;
      an input connected to a gate of the second PFET and to a gate of the second NFET; and
      an output connected to a drain of the second PFET and to a drain of the second NFET.

8. The design structure of claim 7, wherein the design structure comprises a netlist, which describes circuitry on the memory chip.

9. The design structure of claim 7, wherein the design structure resides on a tangible storage medium as a data format used for the exchange of layout data of integrated circuits.

10. The design structure of claim 7, wherein the design structure includes at least one of test data files, characterization data, verification data, or design specifications.

* * * * *